(12) United States Patent
Sebire

(10) Patent No.: US 7,764,657 B2
(45) Date of Patent: Jul. 27, 2010

(54) INTERLEAVING OF INFORMATION BITS

(75) Inventor: Benoist Sebire, Beijing (CN)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/191,650

(22) Filed: Aug. 14, 2008

(65) Prior Publication Data
US 2008/0298272 A1 Dec. 4, 2008

Related U.S. Application Data

(63) Continuation of application No. 10/518,156, filed as application No. PCT/FI03/000499 on Dec. 31, 2003, now Pat. No. 7,430,162.

(30) Foreign Application Priority Data

Jun. 20, 2002 (FI) ................................. 20021222

(51) Int. Cl.
*H04B 7/216* (2006.01)
(52) U.S. Cl. .................. 370/335; 370/204; 370/321; 370/342
(58) Field of Classification Search ............. 370/253, 370/204, 321, 347, 379, 378, 442, 206
See application file for complete search history.

(56) References Cited

U.S. PATENT DOCUMENTS

| | | | | |
|---|---|---|---|---|
| 5,483,541 A * | 1/1996 | Linsky | ........................ | 714/701 |
| 5,533,004 A * | 7/1996 | Jasper et al. | ................. | 370/204 |
| 5,602,875 A | 2/1997 | Mantel et al. | | |
| 5,991,857 A * | 11/1999 | Koetje et al. | ................. | 711/157 |
| 6,202,178 B1 * | 3/2001 | Spruyt | ......................... | 714/702 |
| 6,289,486 B1 * | 9/2001 | Lee et al. | ...................... | 714/788 |
| 6,396,423 B1 * | 5/2002 | Laumen et al. | ................ | 341/95 |
| 6,631,491 B1 * | 10/2003 | Shibutani et al. | ............. | 714/762 |
| 6,701,467 B1 * | 3/2004 | Victor | ......................... | 714/701 |
| 6,774,825 B2 | 8/2004 | Bliss et al. | | |

(Continued)

FOREIGN PATENT DOCUMENTS

EP 0980162 A1 2/2000

(Continued)

OTHER PUBLICATIONS

"Notification of Reason(s) for Refusal," (English Translation), Japanese Patent Application No. 2004-514901, mailed Nov. 10, 2008.

(Continued)

*Primary Examiner*—Ricky Ngo
*Assistant Examiner*—Dewanda Samuel
(74) *Attorney, Agent, or Firm*—Perman & Green LLP

(57) ABSTRACT

The disclosed embodiments relate to a method in a transmitter for interleaving information bits from a data block into transmission bursts. Each of the information bits is assigned with an index. The interleaving includes computing positions of the information bits in the transmission bursts such that the values of the indexes of at least a portion of the information bits are modified. At a receiver it is determined if the value of any of the indexes has been modified before transmission of the transmission bursts. Based on the determination, de-interleaving of the information bits is then accomplished based on modified values of the indexes or originally assigned values of the indexes.

22 Claims, 3 Drawing Sheets

Table 2.
Diagonal Interleaving when shift factor s is used

| k | s | J | b |
|---|---|---|---|
| 0 | 0 | 0 | 0 |
| 1 | 0 | 2 | 1 |
| 2 | 0 | 0 | 2 |
| 3 | 0 | 2 | 3 |
| 4 | 0 | 1 | 4 |
| 5 | 0 | 3 | 5 |
| 6 | 0 | 1 | 6 |
| 7 | 0 | 3 | 7 |
| 8 | 1 | 2 | 0 |
| 9 | 1 | 0 | 1 |
| 10 | 1 | 2 | 2 |
| 11 | 1 | 0 | 3 |
| 12 | 1 | 3 | 4 |
| 13 | 1 | 1 | 5 |
| 14 | 1 | 3 | 6 |
| 15 | 1 | 1 | 7 |

U.S. PATENT DOCUMENTS

| | | | |
|---|---|---|---|
| 6,813,355 B1 * | 11/2004 | Hakaste | 380/270 |
| 6,848,036 B1 * | 1/2005 | Dave et al. | 711/157 |
| 7,091,889 B2 | 8/2006 | Kukla et al. | |
| 7,139,958 B2 * | 11/2006 | Demuynck et al. | 714/751 |
| 7,257,760 B2 * | 8/2007 | Rick et al. | 714/760 |
| 7,434,138 B2 * | 10/2008 | Lin et al. | 714/755 |
| 7,490,282 B2 * | 2/2009 | Spencer et al. | 711/157 |
| 2002/0007475 A1 | 1/2002 | Crozier | |
| 2002/0035709 A1 * | 3/2002 | Chen et al. | 714/702 |
| 2002/0044612 A1 | 4/2002 | Sipola | |
| 2002/0062464 A1 | 5/2002 | Park | |

FOREIGN PATENT DOCUMENTS

| | | |
|---|---|---|
| EP | 0987850 | 3/2000 |
| EP | 0996232 A3 | 5/2000 |
| EP | 1130838 A2 | 9/2001 |
| FI | 108822 B | 3/2002 |
| JP | 2001-292131 A | 10/2001 |
| KR | 2002-0028639 A | 4/2002 |
| WO | 99/07076 | 2/1999 |

OTHER PUBLICATIONS

Korean Office Action, Nov. 25, 2009, Application No. 10-200407020685.

Sai-Weng Lei et al., "Performance Analysis of Adaptive Interleaving for OFDM Systems", Transactions on Vehicular Technology, vol. 51, No. 3, May 2003, pp. 435-444.

Oscar Y. Takeshita, et al., "New Classes of Algebraic Interleavers for Turbo-Codes", ISIT 1998, Cambridge, MA, p. 1.

* cited by examiner

Table 2.

Diagonal Interleaving when shift factor s is used

| k | s | J | b |
|---|---|---|---|
| 0 | 0 | 0 | 0 |
| 1 | 0 | 2 | 1 |
| 2 | 0 | 0 | 2 |
| 3 | 0 | 2 | 3 |
| 4 | 0 | 1 | 4 |
| 5 | 0 | 3 | 5 |
| 6 | 0 | 1 | 6 |
| 7 | 0 | 3 | 7 |
| 8 | 1 | 2 | 0 |
| 9 | 1 | 0 | 1 |
| 10 | 1 | 2 | 2 |
| 11 | 1 | 0 | 3 |
| 12 | 1 | 3 | 4 |
| 13 | 1 | 1 | 5 |
| 14 | 1 | 3 | 6 |
| 15 | 1 | 1 | 7 |

Fig. 5

Table 1.

Diagonal Interleaving with the prior art in accordance with 3GPP TS 45.003

| k | j | b |
|---|---|---|
| 0 | 0 | 0 |
| 1 | 2 | 1 |
| 2 | 0 | 2 |
| 3 | 2 | 3 |
| 4 | 1 | 4 |
| 5 | 3 | 5 |
| 6 | 1 | 6 |
| 7 | 3 | 7 |
| 8 | 0 | 0 |
| 9 | 2 | 1 |
| 10 | 0 | 2 |
| 11 | 2 | 3 |
| 12 | 1 | 4 |
| 13 | 3 | 5 |
| 14 | 1 | 6 |
| 15 | 3 | 7 |

Fig. 4

INTERLEAVING OF INFORMATION BITS

CROSS-REFERENCE TO RELATED APPLICATION(S)

This application is a continuation of, and claims the benefit of and priority to, U.S. patent application Ser. No. 10/518,156, filed on Jul. 22, 2005, now allowed, which claims priority to International Application No. PCT/FI03/000499, International Filing date, Dec. 31, 2003, which designated the United States of America, and which international application was published under PCT Article 21(2) as WO Publication No. WO 2004/001982 and which claims priority from Finnish Application No. 20021222, filed Jun. 20, 2002, all of which are incorporated by reference herein in their entirety.

FIELD

The disclosed embodiments relate to wireless communications. In particular, the disclosed embodiments relate to interleaving of information bits for transmission via a wireless interface. The embodiments can also be applied to de-interleaving of received information bits.

BACKGROUND

Communication systems wherein a wireless interface is provided for entities provided with a transmitter and/or receiver are known. The entities may comprise equipment such as mobile or fixed user equipment (e.g. a mobile telephone), a base station and/or other equipment provided with a transmitter and/or receiver. The communication via the wireless interface may comprise, for example, communication of voice, data, multimedia and so on.

A communication system typically operates in accordance with a given standard or specification which sets out what the various elements of the system are permitted to do and how that should be achieved. For example, the standard or specification may define if the user, or more precisely, user equipment or terminal is provided with a circuit switched service and/or a packet switched service. Communication protocols and/or parameters which shall be used for the connection may also be defined. The hierarchical order of various functions associated with a communications instance may also be defined. In other words, a specific set of "rules" on which the communication can be based on needs to be defined to enable communication by means of the system.

An example of the wireless systems is the public land mobile network (PLMN). A PLMN is a cellular system wherein a base transceiver station (BTS) or similar entity of a radio access network of the communication system serves user equipment (UE) such as mobile stations (MS) via a wireless interface between these entities. A more specific example of the so called second generation (2G) PLMN systems is the Global System for the Mobile communication (GSM).

A further development of the GSM is the so called Enhanced Data rates for GSM Evolution (EDGE). EDGE is a standard that has been prepared by the third generation partnership project (3GPP) and that is now also defined by the ETSI (European Telecommunications Standards Institute). A description of the GSM/EDGE Radio Access Network (GERAN) and channel coding for the GERAN can be found e.g. from 3GPP specification TS 45.003 v5.5.5 (2002-04).

The EDGE enables higher data rates than the more conventional 2G GSM. This improvement has been achieved, among other modifications, by changes in the modulation.

The GERAN is based on use of TDMA (Time Division multiple Access) transmissions. In TDMA based systems the transmission take place in time frames. Each frame can be divided into a plurality of slots. The division of the frames into the slots enables a plurality of users to share the frames. The TDMA frames can be seen as providing the physical channels of the communication media for the transfer of information between two nodes of the communication system. A slot can be used for consecutive frames to form a physical channel for the transmission. A burst is then transmitted within each slot.

A typical TDMA transmitter would comprise means for performing channel encoding, interleaving, burst formation, modulation, and the actual transmission, see FIG. 1. It shall be appreciated that these functions may be provided by means of separate entities or at least some of these functions could be provided by a functional block of the transmitter.

After the channel encoding the information bits are formed into entities known as blocks. The total number of bits in a block depends mainly on the selected encoder. A block is typically transmitted over several bursts, that is, over several consecutive frames, but in a slot.

The information bits in a block are spread to appropriate positions in the bursts by means of the interleaving. Typically the aim is to spread the consecutive information bits as far apart from each other as possible. In the above referenced technical specification 3GPP TS 45.003, a diagonal interleaver is given for handling blocks of 456 coded bits. A block of coded data is interleaver "block diagonal", where a new block starts every 4th block and the data is distributed over 8 blocks. In the given interleaver:

$$\text{for } k = 0, 1, 2, \ldots 455 \quad (1)$$
$$b = k \bmod 8$$
$$j = 2((49k) \bmod 57) + \text{int}\left[\frac{k \bmod 8}{4}\right]$$

where j is the position of the bit k within the burst b.

If we name J the burst size (114 in the following example), K the block size (456), O the ordering parameter (49) and D the interleaving depth (8), the formula (1) can be written:

$$\text{for } k = 0, 1, 2, \ldots K - 1 \quad (2)$$
$$b = k \bmod D$$
$$j = 2\left((O \times k) \bmod \frac{J}{2}\right) + \text{int}\left[\frac{k \bmod D}{4}\right]$$

Note that $\frac{K}{D} = \frac{J}{2}$

This formula is believed to work well as long as half of the block size (K/2) cannot be divided by the interleaving depth (D). This can be done as long as the block size K is larger than the interleaving depth D, i.e.:

$$\frac{K}{2} \bmod D \neq 0 \quad (3)$$

Formula (3) enables a check that the interleaving formula (2) works. In the above example the formula (3) would give ((456/2)mod 8)=4.

The communication systems typically have separated functions. As explained above, the functions can be divided hierarchically into various groups. These are often referred to as layers. Typically the lowest layer in a layer stack would comprise the actual physical transmission media, i.e. the logical traffic channels providing the radio bearers for transmissions. This is often referred to as the physical layer. Layer or layers on top of the physical layer contain functions such as radio link control, Medium Access Control (MAC: a sublayer of radio interface layer 2 providing unacknowledged data transfer service on logical channels and access to transport channels). As only the physical layer is of interest in the context of understanding the present invention, the other layers will not be discussed in any further detail herein.

A Flexible Layer One (FLO) has been proposed for the GERAN within the third generation partnership project (3GPP) standardization. This is a new type of configurable physical layer for the GSM/EDGE Radio Access Network (GERAN). The advantage of the proposed new physical layer is that functions such as channel coding, interleaving and so on would then be specified at call setup stage. This would, in turn, mean that support of new services such as Internet Protocol (IP) Multimedia Subsystem (IMS) Services can be handled without having to specify new coding schemes. Furthermore this physical layer would be more in line to what is specified for the third generation (3G) Universal Mobile Telecommunications Service (UMTS) Terrestrial Radio Access Network (UTRAN).

The inventor has found that the existing diagonal interleavers as the one described above by may not be easily reused for this purpose and that in order to implement the proposal, new type of diagonal interleaver needs to be specified. A reason for this is that the proposal frees bits for transmission of information.

Thus there are some unsolved problems in this regard. Most importantly, the existing diagonal interleavers may no longer work in all situations, for example since the 3GPP proposal enables instances wherein half of the block size can be divided by the interleaving depth. That is, when the relation (3) above is not met, i.e.

$$\frac{K}{2} \bmod D = 0$$

the interleaving formula (2) does not work anymore. This becomes a problem since instead of the previous 57 information bits, the proposal enables transmission (and thus interleaving) of 58 bits and block size of 464 bits (=4 bursts). This would result to 464/2 mod8=0, i.e. the above referenced situation wherein condition (3) is not met.

This problem will be clarified by means of the following simple example of a case in which the relation (3) is not met. Lest assume that:

K=16 block size
J=4 burst size
O=1 ordering parameter
D=8 interleaving depth

It is possible to check by (3) that indeed ((16/2) mod 8)=0, and consequently the condition (3) is not met. Table 1 shown in FIG. 4 lists the values given by the interleaving formula (2) for the above particular example.

As shown by table 1, from bit number 8 onwards, the interleaving formula (2) does not work without problems, since:

bit number 8 is mapped on the same position and the same burst as bit number 0;
bit number 9 is mapped on the same position and the same burst as bit number 1;
bit number 10 is mapped on the same position and the same burst as bit number 2;
bit number 11 is mapped on the same position and the same burst as bit number 3;
bit number 12 is mapped on the same position and the same burst as bit number 4;
bit number 13 is mapped on the same position and the same burst as bit number 5;
bit number 14 is mapped on the same position and the same burst as bit number 6; and
bit number 15 is mapped on the same position and the same burst as bit number 7.

This could cause various problems in transmission and reception of the bits.

SUMMARY

The aspects of the disclosed are directed embodiments of the present invention aim to address the above problem associated with interleaving in instances to avoid inappropriate mapping of information bits in a burst.

According to one aspect of the disclosed embodiments, there is provided a method in a transmitter for interleaving information bits from a data block into transmission bursts, each of the information bits being assigned with an index, the interleaving comprising computing positions of the information bits in the transmission bursts such that the values of the indexes of at least a portion of the information bits are modified.

The modification of said index values may comprise shifting of the index values by means of a shift term. Each information bit to be included in one of the transmission bursts may be provided with an index number, the sum of the index number of each information bit and the shift term may then form the modified value of the index of said information bit for use in the computations.

In a further embodiment it is determined if modification of the values of the indexes is required. The determination may comprise determining if a half of the size of the data block can be divided by the depth of interleaving.

According to another aspect of the disclosed embodiments there is provided a method in a receiver for de-interleaving information bits from received transmission bursts, each of the information bits being assigned with an index, the de-interleaving comprising: determining if the value of any of the indexes has been modified before transmission of the transmission bursts; and based on the determination, de-interleaving the information bits either based on modified values of the indexes or originally assigned values of the indexes.

According to another aspect of the disclosed embodiments there is provided a transmitter comprising:

an interleaver for interleaving information bits from a data block into transmission bursts, each of the information bits being assigned with an index, and means for computing positions of the information bits in the transmission bursts such that the values of the indexes of at least a portion of the information bits are modified before said interleaving.

According to yet another aspect of the disclosed embodiments there is provided a receiver comprising:

a de-interleaver for de-interleaving information bits from received transmission bursts, each of the information bits being assigned with an index; and means for determining if any of the indexes has been modified before transmission of the transmission bursts, the de-interleaver being arranged to de-interleave the information bits either based on modified values of the indexes or originally assigned values of the indexes based on the determination.

The embodiments of the invention may provide means for avoiding mapping of too many information bits in a position in a burst. Diagonal interleaving may be enabled even in instances wherein the condition given by the equation (3) above is not met.

BRIEF DESCRIPTION OF DRAWINGS

For better understanding of the aspects of the disclosed embodiments, reference will now be made by way of example to the accompanying drawings in which:

FIG. 1 shows schematically an arrangement for a transmitter wherein the disclosed embodiments may be applied to;

FIG. 2 shows schematically an arrangement for a receiver wherein the disclosed embodiments may be applied to;

FIG. 4 shows a table of values obtained by means of a prior art interleaving formula; and FIG. 5 shows a table of values obtained by means of an embodiment.

DESCRIPTION OF PREFERRED
EMBODIMENTS OF THE INVENTION

Figure 1:
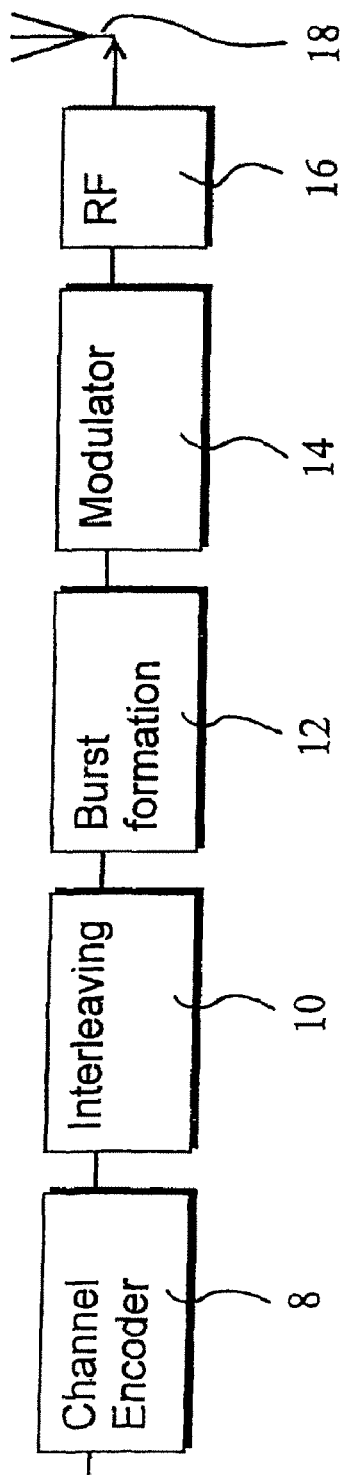

FIG. 1 illustrates schematically some components of a typical TDMA transmitter. More particularly, FIG. 1 shows, in the direction of signals flowing through the transmitter, a channel encoding block 8, an interleaving block 10, a burst formation block 12, a modulation block 14, and a transmission block 16. The transmission block or radio block 16 is typically followed by appropriate antenna means 18. Since the present invention relates to the operation of the interleaving block 10, and since the skilled person is familiar with the purpose and operation of the other blocks, these are not described any further detail in here.

Figure 2:
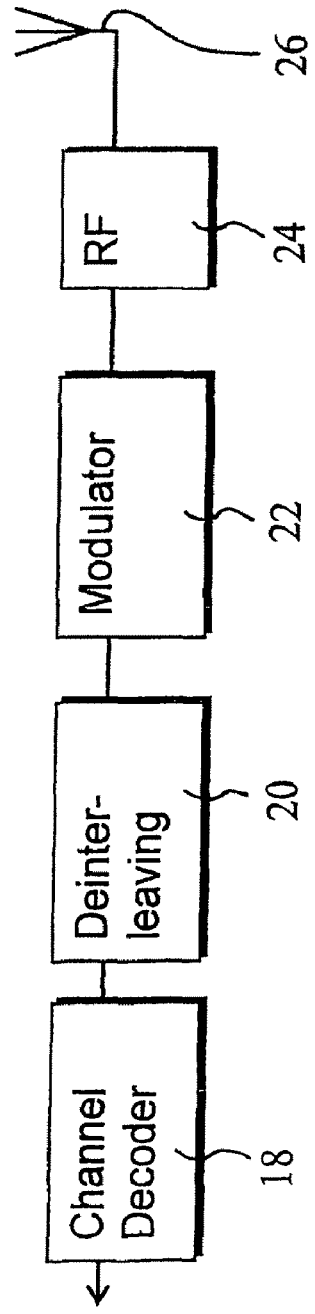

FIG. 2 illustrates schematically some components of a typical TDMA receiver. More particularly, FIG. 2 shows, in the direction in which information signals received by means of appropriate antenna means 26 flow through the receiver, a reception block 24, a modulation block 22, an de-interleaving block 20, and a channel decoding block 18. As above, it is not necessary to explain the purpose and operation of blocks 18, 22, and 24 in any further detail.

Figure 3:
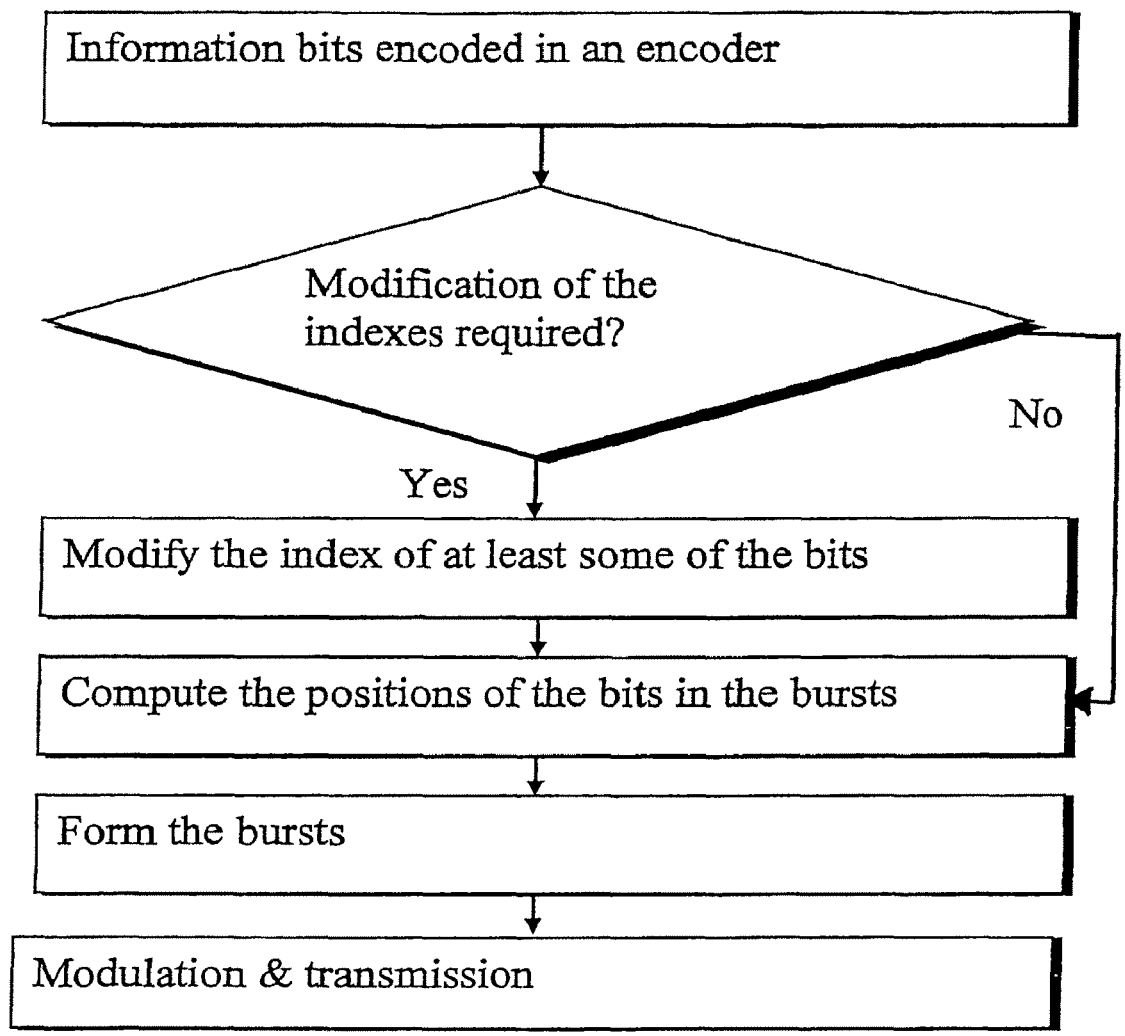
FIG. 3 shows a flowchart for an embodiment.

FIG. 3 shows a flowchart according to one aspect of the disclosed embodiments. In operation, the interleaving block 10 is arranged for interleaving information bits from a data block into transmission bursts. Each of the information bits is assigned with an index. Examples of numeric values of the indexes are shown in column k of the Tables of FIGS. 4 and 5.

In the interleaving process the positions of the information bits in the transmission burst are computed. In accordance with the principles of the disclosed embodiments the positions are computed based on modified values of indexes of at least some of the information bits.

Reference is now also made to FIG. 5 showing Table 2 illustrative of values obtained by means of an embodiment. The parameters of Table 2 in FIG. 5 correspond to the parameters of Table 1 of FIG. 4, except that the values of parameter j have been obtained by using a modified formula (2) for the diagonal interleaving. More particularly, a shift term s is introduced in formula (2).

Use of the new term s can be described in more detail as follows:

$$\text{for } k = 0, 1, 2, \ldots K-1 \quad (4)$$
$$b = k \bmod D$$
$$\text{if } \frac{K}{2} \bmod D = 0$$
$$\text{then } s = \text{int}\left[\frac{k}{K/2}\right]$$
$$\text{else} \quad (5)$$
$$s = 0$$
$$j = \frac{D}{4} \times \left[(O \times (k+s)) \bmod \frac{J}{D/4}\right] + \text{int}\left[\frac{k \bmod D}{4}\right]$$

where j is the position of the bit k within the burst b.

The shift term s is activated only if half of the block size can be divided by the interleaving depth (see (4) above). In the above example the value of the shift term s is 0 for the first half of the block and 1 for the second half.

The value 4 denotes the size of a radio block. In the given example the radio block consists of 4 bursts. If a different radio block is used, then this value shall be changed accordingly.

Except the introduction of the shift term, the computations for obtaining the values of parameter j in Table 2 are based on the above formula (2) and are done with the values as used in the example above. It can be easily noted that because of the shift term s bits are no longer mapped twice in the interleaving stage on the same position, as was the case e.g. for bit Nos 0 and 8, 1 and 9, 3 and 11 and so on in Table 1.

When receiving signals e.g. by means of the FIG. 2 receiver arrangement, the de-interleaving block shall use the same rule as above. For example, the de-interleaving block 20 is aware that the indexes may have been modified, and therefore checks the received bursts. The value of the block may implicitly indicate for the receiver whether modification such as the shifting of the indexes has been used or not.

It shall be appreciated that the index does not necessarily need to consist of a number. For example, the value of the index may be given by means of a character or a character string. The string may comprise, for example, letters, or combinations of letters and numbers.

It shall also be appreciated that while the aspects of the disclosed embodiments have been described in relation to user equipment of a PLMN system the aspects of the disclosed embodiments are applicable to any other suitable type of communication system including transmitter and receiver equipment.

The aspects of the disclosed embodiments have been described in the context of the GSM/EDGE and TDMA system. This invention is also applicable to any other communication systems and access techniques where applicable. Examples of the other access techniques include code division multiple access, frequency division multiple access, space division multiple access as well as any hybrids thereof.

It is also noted herein that while the above describes exemplifying embodiments of the invention, there are several variations and modifications which may be made to the disclosed solution without departing from the scope of the disclosed embodiments as defined in the appended claims.

The invention claimed is:

1. A method in a communication device for interleaving information bits from a data block into transmission bursts, each of the information bits being assigned with an index, the interleaving comprising:

using a transmitter for computing positions of the information bits in the transmission bursts such that values of the indexes of at least a portion of the information bits are modified, wherein the modification of said indexes comprises shifting the values of the indexes to be modified by means of a shift term, and wherein each information bit being included in one of the transmission bursts is provided with an index number, and the sum of the index number of each information bit and the shift term forms the modified value of the index of said information bit for use in the computations.

2. The method as claimed in claim 1, comprising determining if modification of the values of the indexes is required.

3. The method as claimed in claim 1, comprising transmitting the information bits from one of a base station and a mobile station of a mobile communication system.

4. The method as claimed in claim 1, wherein computing the positions of the information bits comprises computing $$j = \frac{D}{M} \times \left[ (O \times (k+s)) \bmod \frac{J}{D/M} \right] + int\left[ \frac{k \bmod D}{M} \right],$$

where
j is the position of the bit k within a burst,
D is the interleaving depth,
M is the size of the radio block in bursts,
O is ordering parameter, and
s is a shift term.

5. A method in a communication device for de-interleaving information bits from received transmission bursts, each of the information bits being assigned with an index, the de-interleaving comprising:

using a receiver for determining if a value of any of the indexes has been modified before transmission of the transmission bursts; and based on the determination, de-interleaving the information bits either based on modified values of the indexes or originally assigned values of the indexes, modifying said indexes by shifting the values of the indexes by a shift term, and wherein each information bit included in a transmission burst is provided with an index number, the apparatus being configured to determine the modified value of the index of each information bit from the sum of the index number of each information bit and the shift term.

6. The method as claimed in claim 5, further comprising computing positions of the information bits by computing $$j = \frac{D}{M} \times \left[ (O \times (k+s)) \bmod \frac{J}{D/M} \right] + int\left[ \frac{k \bmod D}{M} \right],$$

where
j is the position of the bit k within a burst,
D is the interleaving depth,
M is the size of the radio block in bursts,
O is ordering parameter, and
s is a shift term.

7. The method as claimed in claim 5, further comprising receiving the information bits in one of a base station and a mobile station of a mobile communication system.

8. An apparatus configured to:

interleave information bits from a data block into transmission bursts, each of the information bits being assigned with an index, compute positions of the information bits in the transmission bursts such that values of the indexes of at least a portion of the information bits are modified before said interleaving, shift the values of the indexes to be modified based on a shift term; and provide each information bit to be included in one of the transmission bursts with an index number, and to use the sum of the index number of each information bit and the shift term as the modified value of the index of the respective information bit.

9. The apparatus as claimed in claim 8, wherein the apparatus is configured to compute positions of information bits based on $$j = \frac{D}{M} \times \left[ (O \times (k+s)) \bmod \frac{J}{D/M} \right] + int\left[ \frac{k \bmod D}{M} \right],$$

where
j is the position of the bit k within a burst,
D is the interleaving depth,
M is the size of the radio block in bursts,
O is ordering parameter, and
s is a shift term.

10. The apparatus as claimed in claim 8, the apparatus being further configured to determine if modification of the values of the indexes is required.

11. The apparatus as claimed in claim 10, the apparatus being further configured to determine if a half of the size of the data block can be divided by the depth of interleaving.

12. The apparatus as claimed in claim 11, the apparatus being further configured to compute, in response to determination that a half of the size of the data block can be divided by the depth of interleaving, positions of the information bits in the transmission bursts such that the values of the indexes are modified by means of a shift term $$s = int\left[ \frac{k}{K/2} \right]$$

wherein k is the value of the index of the information bit.

13. The apparatus as claimed in claim 8, the apparatus being further configured to be provided in one of a base station and a mobile station of a mobile communication system.

14. The apparatus as claimed in claim 8, the apparatus being further configured for use in association with a transmitter for transmitting information bits based on at least one of time division multiple access (TDMA), code division multiple access (CDMA), frequency division multiple access (FDMA), and space division multiple access (SDMA).

15. The apparatus as claimed in claim 8, the apparatus being further configured for use in association with a transmitter for a GSM/EDGE radio access network.

16. An apparatus configured to:
de-interleave information bits from received transmission bursts, each of the information bits being assigned with an index;
determine if any of the indexes has been modified before transmission of the transmission bursts, wherein the apparatus is configured to de-interleave the information bits either based on modified values of the indexes or originally assigned values of the indexes based on the determination,
modify said indexes by shifting the values of the indexes by a shift term, and
wherein each information bit included in a transmission burst is provided with an index number, the apparatus being configured to determine the modified value of the index of each information bit from the sum of the index number of each information bit and the shift term.

17. The apparatus as claimed in claim 16, the apparatus being further configured to compute positions of information bits based on $$j = \frac{D}{M} \times \left[ (O \times (k+s)) \bmod \frac{J}{D/M} \right] + \text{int}\left[ \frac{k \bmod D}{M} \right],$$

where
j is the position of the bit k within a burst,
D is the interleaving depth,
M is the size of the radio block in bursts,
O is ordering parameter, and
s is a shift term.

18. The apparatus as claimed in claim 16, the apparatus being further configured to determine a half of the size of the data block can be divided by the depth of interleaving.

19. The apparatus as claimed in claim 18, the apparatus being further configured to compute, in response to determination that a half of the size of the data block can be divided by the depth of interleaving, positions of the information bits in the transmission bursts such that the values of the indexes are modified by means of a shift term $$s = \text{int}\left[ \frac{k}{K/2} \right]$$

wherein k is the value of the index of the information bit.

20. The apparatus as claimed in claim 16, the apparatus being further configured to be provided in one of a base station and a mobile station of a mobile communication system.

21. The apparatus as claimed in claim 16, the apparatus being further configured for use in association with a receiver for receiving information bits based on at least one of time division multiple access (TDMA), code division multiple access (CDMA), frequency division multiple access (FDMA), and space division multiple access (SDMA).

22. The apparatus as claimed in claim 16, the apparatus being further configured for use in association with a receiver for a GSM/EDGE radio access network.

* * * * *